US010605852B2

(12) United States Patent
Du et al.

(10) Patent No.: US 10,605,852 B2
(45) Date of Patent: Mar. 31, 2020

(54) CONCOMITANT IMPEDANCE PROTECTION METHOD FOR HALF-WAVELENGTH TRANSMISSION LINE (71) Applicants: CHINA ELECTRIC POWER RESEARCH INSTITUTE COMPANY LIMITED, Beijing (CN); STATE GRID CORPORATION OF CHINA, Beijing (CN); CENTRAL CHINA BRANCH OF STATE GRID CORPORATION OF CHINA, Wuhan (CN)

(72) Inventors: Dingxiang Du, Beijing (CN); Huanzhang Liu, Wuhan (CN); Zexin Zhou, Beijing (CN); Xuming Liang, Beijing (CN); Yarong Guo, Beijing (CN); Xingguo Wang, Beijing (CN); Lianhai Li, Wuhan (CN); Delin Wang, Beijing (CN); Xiao Li, Beijing (CN); Xiangwen Chen, Wuhan (CN)

(73) Assignees: CHINA ELECTRIC POWER RESEARCH INSTITUTE COMPANY LIMITED, Beijing (CN); STATE GRID CORPORATION OF CHINA, Beijing (CN); CENTRAL CHINA BRANCH OF STATE GRID CORPORATION OF CHINA, Wuhan (CN)

( * ) Notice: Subject to any disclaimer, the term of this patent is extended or adjusted under 35 U.S.C. 154(b) by 110 days.

(21) Appl. No.: 15/781,079

(22) PCT Filed: Jun. 30, 2016

(86) PCT No.: PCT/CN2016/087824
§ 371 (c)(1),
(2) Date: Jun. 1, 2018

(87) PCT Pub. No.: WO2017/128613
PCT Pub. Date: Aug. 3, 2017

(65) Prior Publication Data
US 2018/0364292 A1 Dec. 20, 2018

(30) Foreign Application Priority Data

Jan. 28, 2016 (CN) .......................... 2016 1 0058603

(51) Int. Cl.
*G01R 31/08* (2020.01)
*H02H 7/26* (2006.01)
(Continued)

(52) U.S. Cl.
CPC .......... *G01R 31/085* (2013.01); *H02H 7/226* (2013.01); *H02H 7/26* (2013.01); *G01R 19/2513* (2013.01); *H02H 7/261* (2013.01)

(58) Field of Classification Search
CPC .. G01R 31/085; G01R 19/2513; H02H 7/226; H02H 7/26; H02H 7/261
See application file for complete search history.

(56) References Cited

U.S. PATENT DOCUMENTS

| 4,313,169 A | 1/1982 | Takagi |
| 6,529,010 B1 | 3/2003 | Saha |

(Continued)

FOREIGN PATENT DOCUMENTS

| CN | 101227084 A | 7/2008 |
| CN | 101509949 A | 8/2009 |

(Continued)

OTHER PUBLICATIONS

Power System Technology; Sep. 30, 2018; XAIO Shiwu; "A Bergeron Model Based Current Differential Protection Principle for UHV Half-wavelength AC Transmission Line" Clamis 1-7 p. 46-50.

(Continued)

*Primary Examiner* — Amy He
(74) *Attorney, Agent, or Firm* — Syncoda LLC; Feng Ma (57) ABSTRACT

A concomitant impedance protection method for a half-wavelength power transmission line includes that: three- (Continued)

phase currents and three-phase voltages of a relay protection device mounting position at an M side and a relay protection device mounting position at an N side of the half-wavelength power transmission line are acquired respectively; it is judged whether starting amounts of an M side and an N side meet starting conditions or not; a failure point F is determined according to a time difference when the starting amounts of the M side and the N side meet the starting conditions; and a relay protection action of the half-wavelength power transmission line is started according to concomitant impedance of the half-wavelength power transmission line. According to the method, a failure may be located by a time-difference method according to a characteristic of the failure, by compensating the voltages and currents on two sides of the line to construct concomitant impedance, and failures in the region of line can be correctly reflected. Since concomitant impedance protection effectively utilizes two-terminal electrical information, the fault can be quickly and reliably operated in the line region, misoperation on the failures out of the line region can be avoided, and the protection has relatively higher sensitivity.

7 Claims, 2 Drawing Sheets

(51) Int. Cl.
  *H02H 7/22* (2006.01)
  *G01R 19/25* (2006.01)

(56) References Cited

U.S. PATENT DOCUMENTS 9,182,441 B2   11/2015   Saha
2011/0178741 A1   7/2011   Saha

FOREIGN PATENT DOCUMENTS

| CN | 102099698 A | 6/2011 |
| CN | 105552863 A | 5/2016 |
| GB | 2221362 A | 1/1990 |

OTHER PUBLICATIONS

International Search Report in international application No. PCT/CN2016/087824, dated Oct. 28, 2016.
Written Opinion of the International Search Authority in international application No. PCT/CN2016/087824, dated Oct. 28, 2016.

CONCOMITANT IMPEDANCE PROTECTION METHOD FOR HALF-WAVELENGTH TRANSMISSION LINE

TECHNICAL FIELD

The disclosure relates to relay protection of power systems, and particularly to a concomitant impedance protection method for a half-wavelength power transmission line.

BACKGROUND

A half-wavelength alternating current power transmission system is a novel power transmission system, and its power transmission distance is 3,000 kilometers (50 Hz) or 2,600 kilometers (60 Hz). Compared with conventional alternating current power transmission, half-wavelength power transmission has advantages of no requirement on mounting of reactive power compensation devices, excellent economical type, no requirement on arrangement of an intermediate switch station or the like, which is a potential power transmission manner.

In the conventional power transmission line, distance protection adopts a relatively simpler principle, obtaining calculate impedance capable of correctly reflecting the characteristic of the line after a failure, and can act fast and reliably after the failure, which is widely applied to the power transmission line as a fast protection. However, the half-wavelength power transmission line is extremely long in power transmission distance and the distributed capacitance is large, no reactive power compensation device is mounted on the line, the voltages along the line greatly change. Impedance calculated according to a conventional distance protection principle cannot completely reflect a failure characteristic of the line, and such formed distance protection cannot correctly act on failures in and out of a line region.

Therefore, the conventional distance protection may not be applied to the half-wavelength power transmission line.

SUMMARY

In view of this, the embodiments of the disclosure are intended to provide a concomitant impedance protection method for a half-wavelength power transmission line. Its purpose is to locate a failure by means of the time-difference method according to the characteristic of the failure, by compensating the voltages and currents on two sides of the line to construct concomitant impedance, and failures in the region of line can be correctly reflected. Since concomitant impedance protection effectively utilizes two-terminal electrical information, the fault can be quickly and reliably operated in the line region whereas misoperation of the failures out of the line region can be avoided, and the protection has relatively higher sensitivity.

The purpose of the embodiments of the disclosure is implemented by the following technical solutions.

A concomitant impedance protection method for a half-wavelength power transmission line is improved to include:

Step (1): three-phase currents and three-phase voltages of a relay protection device mounting position M and a relay protection device mounting position N of the half-wavelength power transmission line are acquired respectively, wherein the relay protection device mounting position M and the relay protection device mounting position N are on opposite sides;

Step (2): it is determined whether starting amounts of the relay protection device mounting position M and the relay protection device mounting position N of the half-wavelength power transmission line meet starting conditions, Step (3) is executed if YES, and if NO, operations are ended;

Step (3): the failure point F is determined according to the time difference when the starting amounts of the relay protection device mounting position M and the relay protection device mounting position N of the half-wavelength power transmission line meet the starting conditions;

Step (4): compensation currents and compensation voltages of the relay protection device mounting position M and the relay protection device mounting position N of the half-wavelength power transmission line to the failure point F are determined respectively;

Step (5): concomitant impedance of the half-wavelength power transmission line is determined; and Step (6): the concomitant impedance of the half-wavelength power transmission line is formed by steady-state impedance and variation impedance of the half-wavelength power transmission line, and the relay protection action of the half-wavelength power transmission line is started according to the concomitant impedance of the half-wavelength power transmission line.

In an embodiment, in Step (2), a formula of a starting condition of the relay protection device mounting position at an M side of the half-wavelength power transmission line is:

$$\Delta f_M = (\Delta i_{Ma} - \Delta i_{Mb})^2 + (\Delta i_{Mb} - \Delta i_{Mc})^2 + (\Delta i_{Mc} - \Delta i_{Ma})^2 > f_{Mset} \quad (1),$$

in formula (1), $\Delta f_N$ being the starting amount of the relay protection device mounting position M of the half-wavelength power transmission line, $\Delta i_{Ma}$ being the variation of an A-phase current of the relay protection device mounting position M of the half-wavelength power transmission line at a current moment and an A-phase current at a previous cyclic wave, $\Delta i_{Mb}$ being a variation of a B-phase current of the relay protection device mounting position M of the half-wavelength power transmission line at the current moment and a B-phase current at the previous cyclic wave, $\Delta i_{Mc}$ being a variation of a C-phase current of the relay protection device mounting position M of the half-wavelength power transmission line at the current moment and a C-phase current at the previous cyclic wave and $f_{Mset}$ being a fixed value of the starting amount of the relay protection device mounting position M of the half-wavelength power transmission line; and a formula of a starting condition of the relay protection device mounting position at N side of the half-wavelength power transmission line is:

$$\Delta f_N = (\Delta i_{Na} - \Delta i_{Nb})^2 + (\Delta i_{Nb} - \Delta i_{Nc})^2 + (\Delta i_{Nc} - \Delta i_{Na})^2 > f_{Nset} \quad (2),$$

in formula (2), $\Delta f_N$ being the starting amount of the relay protection device mounting position N of the half-wavelength power transmission line, $\Delta i_{Na}$ being a variation of an A-phase current of the relay protection device mounting position N of the half-wavelength power transmission line at the current moment and an A-phase current at the previous cyclic wave, $\Delta i_{Nb}$ being a variation of a B-phase current of the relay protection device mounting position N of the half-wavelength power transmission line at the current moment and a B-phase current at the previous cyclic wave, $\Delta i_{Nc}$ being a variation of a C-phase current of the relay protection device mounting position N of the half-wavelength power transmission line at the current moment and a C-phase current at the previous cyclic wave and $f_{Nset}$ being a fixed value of the starting amount of the relay protection device mounting position N of the half-wavelength power transmission line.

In an embodiment, in Step (3), it is assumed that the relay protection device mounting position M of the half-wavelength power transmission line is located on inner side of the relay protection device mounting position M of the half-wavelength power transmission line, and a formula to determine the failure point F is:

$$x' = \frac{L + c\Delta t}{2}, \quad (3)$$

in formula (3), x' being a distance between the relay protection device mounting position M of the half-wavelength power transmission line and the failure point F, L being a length of the half-wavelength power transmission line, c being a light velocity and $\Delta t$ being the time difference between the starting amounts of the relay protection device mounting position M and the relay protection device mounting position N of the half-wavelength power transmission line meet the starting conditions, that is, $\Delta t = t_M - t_N$, where $t_M$ is the moment when the starting amount of the relay protection device mounting position M of the half-wavelength power transmission line meets the starting condition, and $t_N$ is the moment when the starting amount of the relay protection device mounting position N of the half-wavelength power transmission line meets the starting condition;

if 0<x'<L, the failure occurs in the region of the half-wavelength power transmission line; and if x'>L or x'<0, the failure occurs outside the region of the half-wavelength power transmission line.

In an embodiment, in Step (4), it is assumed that the relay protection device mounting position M of the half-wavelength power transmission line is located on an inner side of the relay protection device mounting position N of the half-wavelength power transmission line, and a formula of the compensation current and compensation voltage of the relay protection device mounting position M of the half-wavelength power transmission line for the failure point F is determined to be:

$$\begin{cases} I_{MX-} = I_{MX}\cosh(\gamma x') - \dfrac{U_{MX}}{Z_c}\sinh(\gamma x') \\ U_{MX-} = U_{MX}\cosh(\gamma x') - I_{MX}Z_c\sinh(\gamma x') \end{cases} \quad (4)$$

in formula (4), $I_{MX-}$ being an X-phase compensation current of the relay protection device mounting position M of the half-wavelength power transmission line for the failure point F, $I_{MX}$ being an X-phase current of the relay protection device mounting position M of the half-wavelength power transmission line, $U_{MX-}$ being an X-phase compensation voltage of the relay protection device mounting position M of the half-wavelength power transmission line for the failure point F, $U_{MX}$ being an X-phase voltage of the relay protection device mounting position M of the half-wavelength power transmission line, x' being the distance between the relay protection device mounting position M of the half-wavelength power transmission line and the failure point F, $\gamma = \sqrt{Y_0 Z_0}$ being a propagation constant of the half-wavelength power transmission line, $Z_c = \sqrt{Z_0/Y_0}$ being wave impedance of the half-wavelength power transmission line, $Y_0$ being admittance of a unit length of the half-wavelength power transmission line, $Z_0$ being impedance of the unit length of the half-wavelength power transmission line and $X \in \{A, B, C\}$, where x' is L when x'>L, L being the length of the half-wavelength power transmission line, and x' is 0 when x'<0; and a formula of the compensation current and compensation voltage of the relay protection device mounting position N of the half-wavelength power transmission line for the failure point F is determined to be:

$$\begin{cases} I_{NX+} = I_{NX}\cosh(\gamma L - \gamma x') - \dfrac{U_{NX}}{Z_c}\sinh(\gamma L - \gamma x') \\ U_{NX+} = U_{NX}\cosh(\gamma L - \gamma x') - I_{NX}Z_c\sinh(\gamma L - \gamma x') \end{cases} \quad (5)$$

in formula (5), $I_{NX+}$ being an X-phase compensation current of the relay protection device mounting position N of the half-wavelength power transmission line for the failure point F, $I_{NX}$ being an X-phase current of the relay protection device mounting position N of the half-wavelength power transmission line, $U_{NX+}$ being an X-phase compensation voltage of the relay protection device mounting position N of the half-wavelength power transmission line for the failure point F, $U_{NX}$ being an X-phase voltage of the relay protection device mounting position N of the half-wavelength power transmission line, x' being the distance between the relay protection device mounting position M of the half-wavelength power transmission line and the failure point F, x' being L when x'>L, L being the length of the half-wavelength power transmission line, and x' being 0 when x'<0.

In an embodiment, the operation that the concomitant impedance of the half-wavelength power transmission line is determined in Step (5) includes that:

a formula of the steady-state impedance of the half-wavelength power transmission line is determined to be:

$$Z_{X\Sigma} = \frac{U_{NX+} + U_{MX-}}{I_{NX+} + I_{MX-}}, \quad (6)$$

in formula (6), $Z_{X\Sigma}$ being X-phase steady-state impedance of the half-wavelength power transmission line, $I_{NX+}$ being the X-phase compensation current of the relay protection device mounting position N of the half-wavelength power transmission line for the failure point F, $U_{NX+}$ being the X-phase compensation voltage of the relay protection device mounting position N of the half-wavelength power transmission line for the failure point F, $I_{MX-}$ being the X-phase compensation current of the relay protection device mounting position M of the half-wavelength power transmission line for the failure point F, $U_{MX-}$ being the X-phase compensation voltage of the relay protection device mounting position M of the half-wavelength power transmission line for the failure point F and $X \in \{A, B, C\}$; and a formula of the variation impedance of the half-wavelength power transmission line is determined to be:

$$\Delta Z_{X\Sigma} = \frac{\Delta U_{NX+} + \Delta U_{MX-}}{\Delta I_{NX+} + \Delta I_{MX-}}, \quad (7)$$

in formula (7), $\Delta Z_{X\Sigma}$ being X-phase variation impedance of the half-wavelength power transmission line, $\Delta U_{NX+}$ being a variation of the X-phase compensation voltage of the relay protection device mounting position N of the half-wavelength power transmission line for the failure point F, $\Delta U_{MX-}$ being a variation of the X-phase compensation voltage of the relay protection device mounting position M of the half-wavelength power transmission line for the failure point F, $\Delta I_{NX+}$ being a variation of the X-phase compensation current of the relay protection device mounting position N of the half-wavelength power transmission line for the failure point F and $\Delta I_{MX-}$ being a variation of the X-phase compensation current of the relay protection device mounting position M of the half-wavelength power transmission line for the failure point F.

In an embodiment, a calculation formula of the variation $\Delta U_{NX+}$ of the X-phase compensation voltage of the relay protection device mounting position N of the half-wavelength power transmission line for the failure point F is:

$$\Delta U_{NX+} = U_{NX+} - U_{NX+}^{-T} \qquad (8),$$

in formula (8), $U_{NX+}$ being the X-phase compensation voltage of the relay protection device mounting position N of the half-wavelength power transmission line for the failure point F, $U_{NX+}^{-T}$ being an X-phase compensation voltage, at the previous cyclic wave, of the relay protection device mounting position N of the half-wavelength power transmission line for the failure point F and $X \in \{A, B, C\}$.

a calculation formula of the variation $\Delta U_{MX-}$ of the X-phase compensation voltage of the relay protection device mounting position M of the half-wavelength power transmission line for the failure point F is:

$$\Delta U_{MX-} = U_{MX-} - U_{MX-}^{-T} \qquad (9),$$

in formula (9), $U_{MX-}$ being the X-phase compensation voltage of the relay protection device mounting position M of the half-wavelength power transmission line for the failure point F and $U_{MX-}^{-T}$ being an X-phase compensation voltage, at the previous cyclic wave, of the relay protection device mounting position M of the half-wavelength power transmission line for the failure point F;

a calculation formula of the variation $\Delta I_{NX+}$ of the X-phase compensation current of the relay protection device mounting position N of the half-wavelength power transmission line for the failure point F is:

$$\Delta I_{NX+} = I_{NX+} - I_{NX+}^{-T} \qquad (10),$$

in formula (10), $I_{NX+}$ being the X-phase compensation current of the relay protection device mounting position N of the half-wavelength power transmission line for the failure point F and $I_{NX+}^{-T}$ being an X-phase compensation current, at the previous cyclic wave, of the relay protection device mounting position N of the half-wavelength power transmission line for the failure point F; and a calculation formula of the variation $\Delta I_{MX-}$ of the X-phase compensation current of the relay protection device mounting position M of the half-wavelength power transmission line for the failure point F is:

$$\Delta I_{MX-} = I_{MX-} - I_{MX-}^{-T} \qquad (11),$$

in formula (11), $I_{MX-}$ being the X-phase compensation current of the relay protection device mounting position M of the half-wavelength power transmission line for the failure point F and $I_{MX-}^{-T}$ being an X-phase compensation current, at the previous cyclic wave, of the relay protection device mounting position M of the half-wavelength power transmission line for the failure point F.

In an embodiment, the operation that the concomitant impedance of the half-wavelength power transmission line is formed by the steady-state impedance and variation imped-ance of the half-wavelength power transmission line and the relay protection action of the half-wavelength power transmission line is started according to the concomitant impedance of the half-wavelength power transmission line in Step (6) includes that:

when an X-phase steady-state impedance $Z_{X\Sigma}$ of the half-wavelength power transmission line meets $Z_{X\Sigma} < Z_{set}$ and an X-phase variation impedance $\Delta Z_{X\Sigma}$ of the half-wavelength power transmission line meets $\Delta Z_{X\Sigma} < \Delta Z_{set}$, an X phase of the half-wavelength power transmission line starts the relay protection action, $\Delta Z_{set}$ being a fixed value of the X-phase variation impedance of the half-wavelength power transmission line and $X \in \{A, B, C\}$.

The disclosure has the following beneficial effects.

In a conventional art, since a half-wavelength power transmission line is long, and has high in distributed capacitance and unique in electrical characteristic, conventional single terminal protection such as distance protection may not distinguish between internal and external failures of a line region, which cannot correctly act. The concomitant impedance protection method provided by the disclosure for the half-wavelength power transmission line may locate the failure by means of a time-difference method according to a characteristic of the failure, compensates voltages and currents on two sides of the line to construct concomitant impedance, and may correctly reflect internal and external failures of the line region. Since concomitant impedance protection effectively utilizes two-terminal electrical information, the fault can be quickly and reliably operated in the line region, whereas misoperation of the failures out of the line region can be avoided, and the protection has relatively higher sensitivity.

DETAILED DESCRIPTION

In order to make the purpose, technical solution and advantages of the embodiments of the disclosure clearer, the technical solutions in the embodiments of the disclosure will be clearly and completely described below in combination with the drawings in the embodiments of the disclosure. Apparently, the described embodiments are not all embodiments but part of embodiments of the disclosure. All other embodiments obtained by those skilled in the art on the basis of the embodiments in the disclosure without creative work fall within the scope of protection of the disclosure.

Figure 1:
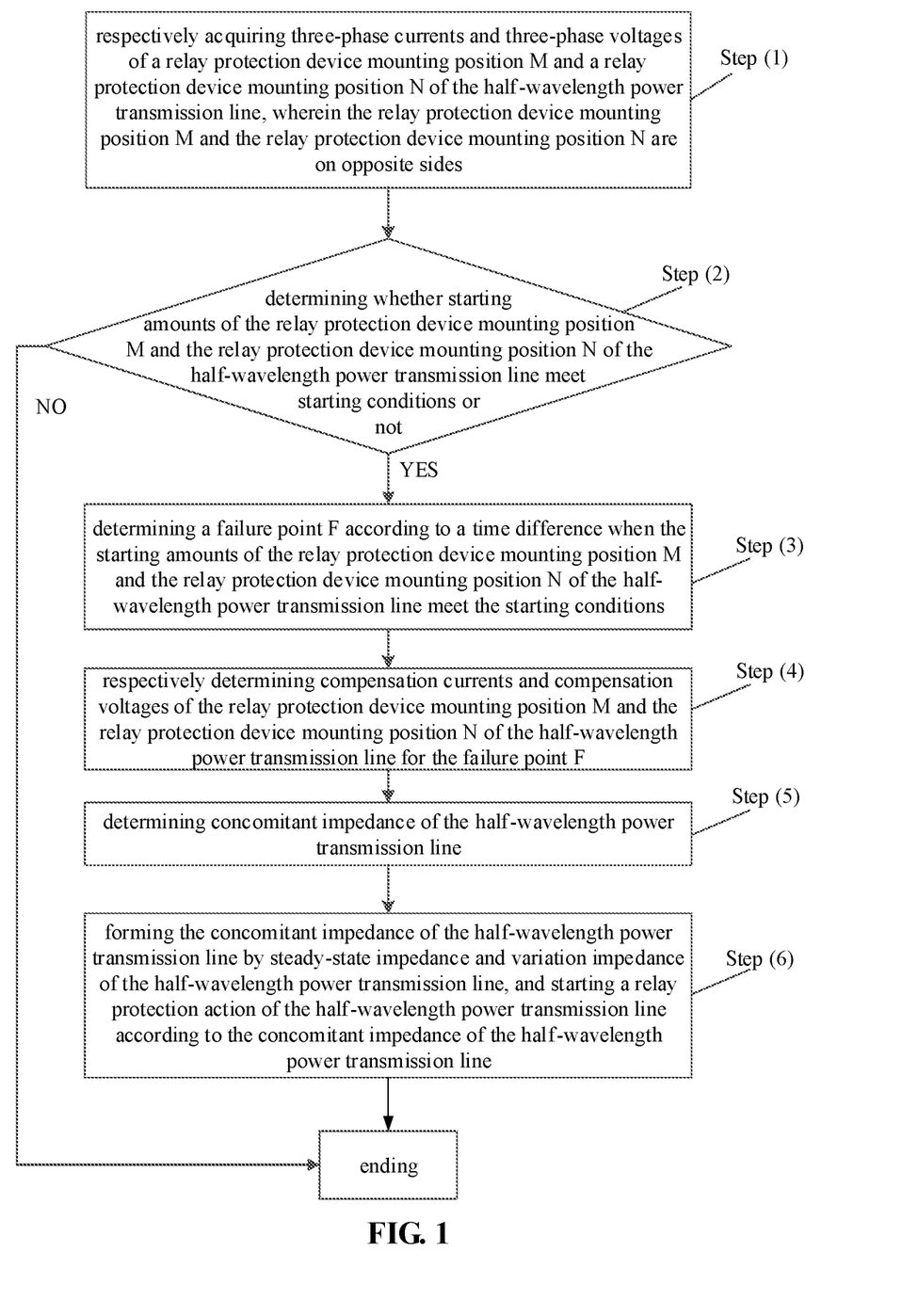
FIG. 1 is a flowchart of a concomitant impedance protection method for a half-wavelength power transmission line according to an embodiment of the disclosure.

A concomitant impedance protection method provided by the disclosure for a half-wavelength power transmission line, as shown in FIG. 1, includes the following steps.

In Step (1), three-phase currents and three-phase voltages of a relay protection device mounting position M and a relay protection device mounting position N of the half-wavelength power transmission line are acquired respectively. Herein, the relay protection device mounting position M and the relay protection device mounting position N are on opposite sides.

In Step (2), it is determined whether starting amounts of the relay protection device mounting position M and the relay protection device mounting position N of the half-wavelength power transmission line meet starting conditions or not, Step (3) is executed if YES, and if NO, operations are ended.

In Step (3), a failure point F is determined according to a time difference when the starting amounts of the relay protection device mounting position M and the relay protection device mounting position N of the half-wavelength power transmission line meet the starting conditions.

In Step (4), compensation currents and compensation voltages of the relay protection device mounting position M and the relay protection device mounting position N of the half-wavelength power transmission line to the failure point F are determined respectively.

In Step (5), concomitant impedance of the half-wavelength power transmission line is determined.

In Step (6), the concomitant impedance of the half-wavelength power transmission line is formed by steady-state impedance and variation impedance of the half-wavelength power transmission line, and a relay protection action of the half-wavelength power transmission line is started according to the concomitant impedance of the half-wavelength power transmission line.

In an embodiment, in Step (2), the starting condition of the relay protection device mounting position at an M side of the half-wavelength power transmission line is expressed by:

$$\Delta f_M = (\Delta i_{ma} - \Delta i_{Mb})^2 + (\Delta i_{Mb} - \Delta i_{Mc})^2 + (\Delta i_{Mc} - \Delta i_{Ma})^2 > f_{Mset} \quad (1),$$

in formula (1), $\Delta f_M$ being the starting amount of the relay protection device mounting position M of the half-wavelength power transmission line, $\Delta i_{Ma}$ being a variation of an A-phase current of the relay protection device mounting position M of the half-wavelength power transmission line at a current moment and an A-phase current at a previous cyclic wave, $\Delta i_{Mb}$ being a variation of a B-phase current of the relay protection device mounting position M of the half-wavelength power transmission line at the current moment and a B-phase current at the previous cyclic wave, $\Delta i_{Mc}$ being a variation of a C-phase current of the relay protection device mounting position M of the half-wavelength power transmission line at the current moment and a C-phase current at the previous cyclic wave and $f_{Mset}$ being a fixed value of the starting amount of the relay protection device mounting position M of the half-wavelength power transmission line.

Herein a cyclic wave is 20 ms.

A formula of a starting condition of the relay protection device mounting position at an N side of the half-wavelength power transmission line is expressed by:

$$\Delta f_N = (\Delta i_{Na} - \Delta i_{Nb})^2 + (\Delta i_{Nb} - \Delta i_{Nc})^2 + (\Delta i_{Nc} - \Delta i_{Na})^2 > f_{Nset} \quad (2),$$

in formula (2), $\Delta f_N$ being the starting amount of the relay protection device mounting position N of the half-wavelength power transmission line, $\Delta i_{Na}$ being a variation of an A-phase current of the relay protection device mounting position N of the half-wavelength power transmission line at the current moment and an A-phase current at the previous cyclic wave, $\Delta i_{Nb}$ being a variation of a B-phase current of the relay protection device mounting position N of the half-wavelength power transmission line at the current moment and a B-phase current at the previous cyclic wave, $\Delta i_{Nc}$ being a variation of a C-phase current of the relay protection device mounting position N of the half-wavelength power transmission line at the current moment and a C-phase current at the previous cyclic wave and $f_{Nset}$ being a fixed value of the starting amount of the relay protection device mounting position N of the half-wavelength power transmission line.

Figure 2:
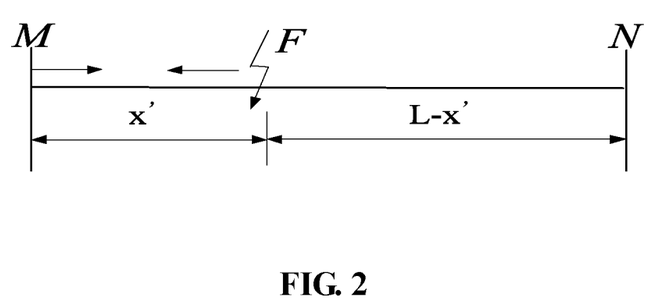
FIG. 2 is a schematic diagram of an application scenario of a concomitant impedance protection method for a half-wavelength power transmission line according to an embodiment of the disclosure.

In Step (3), as shown in FIG. 2, it is assumed that the relay protection device mounting position M of the half-wavelength power transmission line is located on an inner side of the relay protection device mounting position M of the half-wavelength power transmission line, and a formula to determine the failure point F is:

$$x' = \frac{L + c\Delta t}{2}, \quad (3)$$

in formula (3), x' being a distance between the relay protection device mounting position M of the half-wavelength power transmission line and the failure point F, L being a length of the half-wavelength power transmission line, c being a light velocity and $\Delta t$ being the time difference between the starting amounts of the relay protection device mounting position M and relay protection device mounting position N of the half-wavelength power transmission line meet the starting conditions, that is, $\Delta t = t_M - t_N$, where $t_M$ is a moment when the starting amount of the relay protection device mounting position M of the half-wavelength power transmission line meets the starting condition, and $t_N$ is a moment when the starting amount of the relay protection device mounting position N of the half-wavelength power transmission line meets the starting condition;

if $0 < x' < L$, a failure occurs in a region of the half-wavelength power transmission line; and if $x' > L$ or $x' < 0$, the failure occurs outside the region of the half-wavelength power transmission line.

In Step (4), it is assumed that the relay protection device mounting position M of the half-wavelength power transmission line is located on an inner side of the relay protection device mounting position N of the half-wavelength power transmission line, and a formula of the compensation current and compensation voltage of the relay protection device mounting position M of the half-wavelength power transmission line for the failure point F is determined to be:

$$\begin{cases} I_{MX-} = I_{MX}\cosh(\gamma x') - \dfrac{U_{MX}}{Z_c}\sinh(\gamma x') \\ U_{MX-} = U_{MX}\cosh(\gamma x') - I_{MX}Z_c\sinh(\gamma x') \end{cases}, \quad (4)$$

in formula (4), $I_{MX-}$ being an X-phase compensation current of the relay protection device mounting position M of the half-wavelength power transmission line for the failure point F, $I_{MX}$ being an X-phase current of the relay protection device mounting position M of the half-wavelength power transmission line, being an X-phase compensation voltage of the relay protection device mounting position M of the half-wavelength power transmission line for the failure point F, $U_{MX-}$ being an X-phase voltage of the relay protection device mounting position M of the half-wavelength power transmission line, x' being the distance between the relay protection device mounting position M of the half-wavelength power transmission line and the failure point F, $\gamma = \sqrt{Y_0 Z_0}$ being a propagation constant of the half-wavelength power transmission line, $Z_c = \sqrt{Z_0/Y_0}$ being wave impedance of the half-wavelength power transmission line, $Y_0$ being admittance of a unit length of the half-wavelength power transmission line, $Z_0$ being impedance of the unit length of the half-wavelength power transmission line and X∈{A, B, C}, where x' is L when x'>L, L being the length of the half-wavelength power transmission line, and x' is 0 when x'<0; and a formula of the compensation current and compensation voltage of the relay protection device mounting position N of the half-wavelength power transmission line for the failure point F is determined to be:

$$\begin{cases} I_{NX+} = I_{NX}\cosh(\gamma L - \gamma x') - \dfrac{U_{NX}}{Z_c}\sinh(\gamma L - \gamma x') \\ U_{NX+} = U_{NX}\cosh(\gamma L - \gamma x') - I_{NX}Z_c\sinh(\gamma L - \gamma x') \end{cases} \quad (5)$$

in formula (5), $I_{NX+}$ being an X-phase compensation current of the relay protection device mounting position N of the half-wavelength power transmission line for the failure point F, $I_{NX}$ being an X-phase current of the relay protection device mounting position N of the half-wavelength power transmission line, $U_{NX+}$ being an X-phase compensation voltage of the relay protection device mounting position N of the half-wavelength power transmission line for the failure point F, $U_{NX}$ being an X-phase voltage of the relay protection device mounting position N of the half-wavelength power transmission line, x' being the distance between the relay protection device mounting position M of the half-wavelength power transmission line and the failure point F, x' being L when x'>L, L being the length of the half-wavelength power transmission line, and x' being 0 when x'<0.

The operation that the concomitant impedance of the half-wavelength power transmission line is determined in Step (5) includes that:

a formula of the steady-state impedance of the half-wavelength power transmission line is determined to be:

$$Z_{X\Sigma} = \dfrac{U_{NX+} + U_{MX-}}{I_{NX+} + I_{MX-}}, \quad (6)$$

in formula (6), $Z_{X\Sigma}$ being X-phase steady-state impedance of the half-wavelength power transmission line, $I_{NX+}$ being the X-phase compensation current of the relay protection device mounting position N of the half-wavelength power transmission line for the failure point F, $U_{NX+}$ being the X-phase compensation voltage of the relay protection device mounting position N of the half-wavelength power transmission line for the failure point F, $U_{MX-}$ being the X-phase compensation current of the relay protection device mounting position M of the half-wavelength power transmission line for the failure point F, $U_{MX-}$ being the X-phase compensation voltage of the relay protection device mounting position M of the half-wavelength power transmission line for the failure point F and X∈{A, B, C}; and a formula of the variation impedance of the half-wavelength power transmission line is determined to be:

$$\Delta Z_{X\Sigma} = \dfrac{\Delta U_{NX+} + \Delta U_{MX-}}{\Delta I_{NX+} + \Delta I_{MX-}}, \quad (7)$$

in formula (7), $\Delta Z_{X\Sigma}$ being X-phase variation impedance of the half-wavelength power transmission line, $\Delta U_{NX+}$ being a variation of the X-phase compensation voltage of the relay protection device mounting position N of the half-wavelength power transmission line for the failure point F, $\Delta U_{MX-}$ being a variation of the X-phase compensation voltage of the relay protection device mounting position M of the half-wavelength power transmission line for the failure point F, $\Delta I_{NX+}$ being a variation of the X-phase compensation current of the relay protection device mounting position N of the half-wavelength power transmission line for the failure point F and $\Delta I_{MX-}$ being a variation of the X-phase compensation current of the relay protection device mounting position M of the half-wavelength power transmission line for the failure point F.

Herein, a calculation formula of the variation $\Delta U_{NX+}$ of the X-phase compensation voltage of the relay protection device mounting position N of the half-wavelength power transmission line for the failure point F is:

$$\Delta U_{NX+} = U_{NX+} - U_{NX+}^{-T} \quad (8),$$

in formula (8), $U_{NX+}$ being the X-phase compensation voltage of the relay protection device mounting position N of the half-wavelength power transmission line for the failure point F, $U_{NX+}^{-T}$ being an X-phase compensation voltage, at the previous cyclic wave, of the relay protection device mounting position N of the half-wavelength power transmission line for the failure point F and X∈{A, B, C};

a calculation formula of the variation $\Delta U_{MX-}$ of the X-phase compensation voltage of the relay protection device mounting position M of the half-wavelength power transmission line for the failure point F is:

$$\Delta U_{MX-} = U_{MX-} - U_{MX-}^{-T} \quad (9),$$

in formula (9), $U_{MX-}$ being the X-phase compensation voltage of the relay protection device mounting position M of the half-wavelength power transmission line for the failure point F and $U_{MX-}^{-T}$ being an X-phase compensation voltage, at the previous cyclic wave, of the relay protection device mounting position M of the half-wavelength power transmission line for the failure point F;

a calculation formula of the variation $\Delta I_{NX+}$ of the X-phase compensation current of the relay protection device mounting position N of the half-wavelength power transmission line for the failure point F is:

$$\Delta I_{NX+} = I_{NX+} - I_{NX+}^{-T} \quad (10),$$

in formula (10), $I_{NX+}$ being the X-phase compensation current of the relay protection device mounting position N of the half-wavelength power transmission line for the failure point F and $I_{NX+}^{-T}$ being an X-phase compensation current, at the previous cyclic wave, of the relay protection device mounting position N of the half-wavelength power transmission line for the failure point F; and a calculation formula of the variation $\Delta I_{MX-}$ of the X-phase compensation current of the relay protection device mounting position M of the half-wavelength power transmission line for the failure point F is:

$$\Delta I_{MX-} = I_{MX-} - I_{MX-}^{-T} \quad (11),$$

in formula (11), $I_{MX-}$ being the X-phase compensation current of the relay protection device mounting position M of the half-wavelength power transmission line for the failure point F and $I_{MX-}^{-T}$ being an X-phase compensation current, at the previous cyclic wave, of the relay protection device mounting position M of the half-wavelength power transmission line for the failure point F.

The operation that the concomitant impedance of the half-wavelength power transmission line is formed by the steady-state impedance and variation impedance of the half-wavelength power transmission line and the relay protection action of the half-wavelength power transmission line is started according to the concomitant impedance of the half-wavelength power transmission line in Step (6) includes that:

when the X-phase steady-state impedance $Z_{X\Sigma}$ of the half-wavelength power transmission line meets $Z_{X\Sigma} < Z_{set}$ and the X-phase variation impedance $\Delta Z_{X\Sigma}$ of the half-wavelength power transmission line meets $\Delta Z_{X\Sigma} < \Delta Z_{set}$, an X phase of the half-wavelength power transmission line starts the relay protection action, $\Delta Z_{set}$ being a fixed value of the X-phase variation impedance of the half-wavelength power transmission line and $X \in \{A, B, C\}$.

It should finally be noted that: the above embodiments are intended not to limit but describe the technical solutions of the disclosure. Although the disclosure has been described with reference to the above embodiments in detail, those skilled in the art should understand that modifications or equivalent replacements may still be made to specific implementation modes of the disclosure, and any modifications or equivalent replacements made without departing from the spirit and scope of the disclosure shall fall within the scope of the claims of the disclosure.

INDUSTRIAL APPLICABILITY

The concomitant impedance protection method provided by the embodiments of the disclosure for the half-wavelength power transmission line includes the following steps.

At Step (1), the three-phase currents and the three-phase voltages of the relay protection device mounting position M and the relay protection device mounting position N of the half-wavelength power transmission line are acquired respectively, wherein the relay protection device mounting position M and the relay protection device mounting position N are on opposite sides.

At Step (2), it is determined whether the starting amounts of the relay protection device mounting position M and the relay protection device mounting position N of the half-wavelength power transmission line meet the starting conditions or not, Step (3) is executed if YES, and if NO, the operations are ended. At Step (3), the failure point F is determined according to the time difference when the starting amounts of the relay protection device mounting position M and the relay protection device mounting position N of the half-wavelength power transmission line meet the starting conditions.

At Step (4), the compensation currents and compensation voltages of the relay protection device mounting position M and relay protection device mounting position N of the half-wavelength power transmission line to the failure point F are determined respectively.

At Step (5), the concomitant impedance of the half-wavelength power transmission line is determined.

At Step (6), the concomitant impedance of the half-wavelength power transmission line is formed by the steady-state impedance and variation impedance of the half-wavelength power transmission line, and the relay protection action of the half-wavelength power transmission line is started according to the concomitant impedance of the half-wavelength power transmission line. In such a manner, a failure may be located according to a time-difference method according to a characteristic of the failure, by compensating the voltages and currents on two sides of the line to construct concomitant impedance, and failures in the region of line can be correctly reflected. Since concomitant impedance protection effectively utilizes two-terminal electrical information, the fault can be quickly and reliably operated in the line region, misoperation of the failures out of the line region can be avoided, and the protection has relatively higher sensitivity.

The invention claimed is:

1. A concomitant impedance protection method for a half-wavelength power transmission line, comprising:

Step (1): acquiring three-phase currents and three-phase voltages of a relay protection device mounting position M and a relay protection device mounting position N of the half-wavelength power transmission line respectively, wherein the relay protection device mounting position M and the relay protection device mounting position N are on opposite sides;

Step (2): determining whether starting amounts of the relay protection device mounting position M and the relay protection device mounting position N of the half-wavelength power transmission line meet starting conditions or not, executing Step (3) if the starting amounts of the relay protection device mounting position M and the relay protection device mounting position N of the half-wavelength power transmission line meet the starting conditions; otherwise, ending;

Step (3): determining a failure point F according to a time difference when the starting amounts of the relay protection device mounting position M and the relay protection device mounting position N of the half-wavelength power transmission line meet the starting conditions;

Step (4): determining compensation currents and compensation voltages of the relay protection device mounting position M and the relay protection device mounting position N of the half-wavelength power transmission line for the failure point F respectively;

Step (5): determining concomitant impedance of the half-wavelength power transmission line; and Step (6): forming, by steady-state impedance and variation impedance of the half-wavelength power transmission line, the concomitant impedance of the half-wavelength power transmission line, and starting a relay protection action of the half-wavelength power transmission line according to the concomitant impedance of the half-wavelength power transmission line.

2. The method according to claim 1, wherein, in Step (2), a starting condition of the relay protection device mounting position at an M side of the half-wavelength power transmission line is expressed by:

$$\Delta f_M = (\Delta i_{Ma} - \Delta i_{Mb})^2 + (\Delta i_{Mb} - \Delta i_{Mc})^2 + (\Delta i_{Mc} - \Delta i_{Ma})^2 > f_{Mset} \quad (1),$$

in formula (1), $\Delta f_M$ being the starting amount of the relay protection device mounting position M of the half-wavelength power transmission line, $\Delta i_{Ma}$ being a variation of an A-phase current of the relay protection device mounting position M of the half-wavelength power transmission line at a current moment and an A-phase current at a previous cyclic wave, $\Delta i_{Mb}$ being a variation of a B-phase current of the relay protection device mounting position M of the half-wavelength power transmission line at the current moment and a B-phase current at the previous cyclic wave, $\Delta i_{Mc}$ being a variation of a C-phase current of the relay protection device mounting position M of the half-wavelength power transmission line at the current moment and a C-phase current at the previous cyclic wave and $F_{Mset}$ being a fixed value of the starting amount of the relay protection device mounting position M of the half-wavelength power transmission line; and a starting condition of the relay protection device mounting position at an N side of the half-wavelength power transmission line is expressed by:

$$\Delta f_N = (\Delta i_{Na} - \Delta i_{Nb})^2 + (\Delta i_{Nb} - \Delta i_{Nc})^2 + (\Delta i_{Nc} - \Delta i_{Na})^2 > f_{Nset} \qquad (2),$$

in formula (2), $\Delta f_N$ being the starting amount of the relay protection device mounting position N of the half-wavelength power transmission line, $\Delta i_{Na}$ being a variation of an A-phase current of the relay protection device mounting position N of the half-wavelength power transmission line at the current moment and an A-phase current at the previous cyclic wave, $\Delta i_{Nb}$ being a variation of a B-phase current of the relay protection device mounting position N of the half-wavelength power transmission line at the current moment and a B-phase current at the previous cyclic wave, $\Delta i_{Nc}$ being a variation of a C-phase current of the relay protection device mounting position N of the half-wavelength power transmission line at the current moment and a C-phase current at the previous cyclic wave and $f_{Nset}$ being a fixed value of the starting amount of the relay protection device mounting position N of the half-wavelength power transmission line.

3. The method according to claim 1, wherein, in Step (3), it is assumed that the relay protection device mounting position M of the half-wavelength power transmission line is located on an inner side of the relay protection device mounting position N of the half-wavelength power transmission line, and a formula to determine the failure point F is:

$$x' = \frac{L + c\Delta t}{2}, \qquad (3)$$

in formula (3), x' being a distance between the relay protection device mounting position M of the half-wavelength power transmission line and the failure point F, L being a length of the half-wavelength power transmission line, C being a light velocity and $\Delta t$ being the time difference between the starting amounts of the relay protection device mounting position M and the relay protection device mounting position N of the half-wavelength power transmission line meet the starting conditions, that is, $\Delta t = t_M - t_n$, where $t_M$ is a moment when the starting amount of the relay protection device mounting position M of the half-wavelength power transmission line meets the starting condition, and $t_N$ is a moment when the starting amount of the relay protection device mounting position N of the half-wavelength power transmission line meets the starting condition;

if $0 < x' < L$, a failure occurs in a region of the half-wavelength power transmission line; and if $x' > L$ or $x' < 0$, the failure occurs outside the region of the half-wavelength power transmission line.

4. The method according to claim 1, wherein, in Step (4), it is assumed that the relay protection device mounting position M of the half-wavelength power transmission line is located on an inner side of the relay protection device mounting position N of the half-wavelength power transmission line, and a formula of the compensation current and compensation voltage of the relay protection device mounting position M of the half-wavelength power transmission line for the failure point F is determined to be:

$$\begin{cases} I_{MX-} = I_{MX}\cosh(\gamma x') - \dfrac{U_{MX}}{Z_c}\sinh(\gamma x') \\ U_{MX-} = U_{MX}\cosh(\gamma x') - I_{MX}Z_c\sinh(\gamma x') \end{cases} \qquad (4)$$

in formula (4), $I_{MX-}$ being an X-phase compensation current of the relay protection device mounting position M of the half-wavelength power transmission line for the failure point F, $I_{MX}$ being an X-phase current of the relay protection device mounting position M of the half-wavelength power transmission line, $U_{MX-}$ being an X-phase compensation voltage of the relay protection device mounting position M of the half-wavelength power transmission line for the failure point F, $U_{MX}$ being an X-phase voltage of the relay protection device mounting position M of the half-wavelength power transmission line, x' being the distance between the relay protection device mounting position M of the half-wavelength power transmission line and the failure point F, $\gamma = \sqrt{Y_0 Z_0}$ being a propagation constant of the half-wavelength power transmission line, $Z_c = \sqrt{Z_0/Y_0}$ being wave impedance of the half-wavelength power transmission line, $Y_0$ being admittance of a unit length of the half-wavelength power transmission line, $Z_0$ being impedance of the unit length of the half-wavelength power transmission line and $X \in \{A,B,C\}$, where x' is L when x'>L, L being the length of the half-wavelength power transmission line, and x' is 0 when x'<0; and a formula of the compensation current and compensation voltage of the relay protection device mounting position N of the half-wavelength power transmission line for the failure point F is determined to be:

$$\begin{cases} I_{NX+} = I_{NX}\cosh(\gamma L - \gamma x') - \dfrac{U_{NX}}{Z_c}\sinh(\gamma L - \gamma x') \\ U_{NX+} = U_{NX}\cosh(\gamma L - \gamma x') - I_{NX}Z_c\sinh(\gamma L - \gamma x') \end{cases} \qquad (5)$$

in formula (5), $I_{NX+}$ being an X-phase compensation current of the relay protection device mounting position N of the half-wavelength power transmission line for the failure point F, $I_{NX}$ being an X-phase current of the relay protection device mounting position N of the half-wavelength power transmission line, $U_{NX+}$ being an X-phase compensation voltage of the relay protection device mounting position N of the half-wavelength power transmission line for the failure point F, $U_{NX}$ being an X-phase voltage of the relay protection device mounting position N of the half-wavelength power transmission line, x' being the distance between the relay protection device mounting position M of the half-wavelength power transmission line and the failure point F, x' being L when x'>L, L being the length of the half-wavelength power transmission line, and x' being 0 when x'<0.

5. The method according to claim 1, wherein determining the concomitant impedance of the half-wavelength power transmission line in Step (5) comprises:

determining a formula of the steady-state impedance of the half-wavelength power transmission line to be:

$$Z_{X\Sigma} = \frac{U_{NX+} + U_{MX-}}{I_{NX+} + I_{MX-}}, \qquad (6)$$

in formula (6), $Z_{X\Sigma}$ being X-phase steady-state impedance of the half-wavelength power transmission line, $I_{NX+}$ being the X-phase compensation current of the relay protection device mounting position N of the half-wavelength power transmission line for the failure point F, $U_+$ being the X-phase compensation voltage of the relay protection device mounting position N of the half-wavelength power transmission line for the failure point F, $I_{MX-}$ being the X-phase compensation current of the relay protection device mounting position M of the half-wavelength power transmission line for the failure point F, $U_{MX-}$ being the X-phase compensation voltage of the relay protection device mounting position M of the half-wavelength power transmission line for the failure point F and $X \in \{A,B,C\}$; and determining a formula of the variation impedance of the half-wavelength power transmission line to be:

$$\Delta Z_{X\Sigma} = \frac{\Delta U_{NX+} + \Delta U_{MX-}}{\Delta I_{NX+} + \Delta I_{MX-}}, \quad (7)$$

in formula (7), $\Delta Z_{X\Sigma}$ being X-phase variation impedance of the half-wavelength power transmission line, $\Delta U_{NX+}$ being a variation of the X-phase compensation voltage of the relay protection device mounting position N of the half-wavelength power transmission line for the failure point F, $\Delta U_{MX-}$ being a variation of the X-phase compensation voltage of the relay protection device mounting position M of the half-wavelength power transmission line for the failure point F, $\Delta I_{NX+}$ being a variation of the X-phase compensation current of the relay protection device mounting position N of the half-wavelength power transmission line for the failure point F and $\Delta I_{MX-}$ being a variation of the X-phase compensation current of the relay protection device mounting position M of the half-wavelength power transmission line for the failure point F.

6. The method according to claim 5, wherein a calculation formula of the variation $\Delta U_{NX+}$ of the X-phase compensation voltage of the relay protection device mounting position N of the half-wavelength power transmission line for the failure point F is:

$$\Delta U_{NX+} = U_{NX+} - U_{NX+}^{-T} \quad (8),$$

in formula (8), $U_{NX+}$ being the X-phase compensation voltage of the relay protection device mounting position N of the half-wavelength power transmission line for the failure point F, $U_{NX+}^{-t}$ being an X-phase compensation voltage, at the previous cyclic wave, of the relay protection device mounting position N of the half-wavelength power transmission line for the failure point F and $X \in \{A,B,C\}$;

a calculation formula of the variation $\Delta U_{MX-}$ of the X-phase compensation voltage of the relay protection device mounting position M of the half-wavelength power transmission line for the failure point F is:

$$\Delta U_{MX-} = U_{MX-} - U_{MX-}^{-} \quad (9),$$

in formula (9), $U_{MX-}$ being the X-phase compensation voltage of the relay protection device mounting position M of the half-wavelength power transmission line for the failure point F and $U_{MX-}^{-T}$ being an X-phase compensation voltage, at the previous cyclic wave, of the relay protection device mounting position M of the half-wavelength power transmission line for the failure point F;

a calculation formula of the variation $\Delta I_{NX+}$ of the X-phase compensation current of the relay protection device mounting position N of the half-wavelength power transmission line for the failure point F is:

$$\Delta I_{NX+} = I_{NX+} - I_{NX+}^{-T} \quad (10),$$

in formula (10), $I_{NX+}$ being the X-phase compensation current of the relay protection device mounting position N of the half-wavelength power transmission line for the failure point F and $I_{NX+}^{-T}$ being an X-phase compensation current, at the previous cyclic wave, of the relay protection device mounting position N of the half-wavelength power transmission line for the failure point F; and a calculation formula of the variation $\Delta I_{MX-}$ of the X-phase compensation current of the relay protection device mounting position M of the half-wavelength power transmission line for the failure point F is:

$$\Delta I_{MX-} = I_{MX-} - I_{MX-}^{-T} \quad (11),$$

in formula (11), $I_{MX-}$ being the X-phase compensation current of the relay protection device mounting position M of the half-wavelength power transmission line for the failure point F and $I_{MX-}^{-T}$ being an X-phase compensation current, at the previous cyclic wave, of the relay protection device mounting position M of the half-wavelength power transmission line for the failure point F.

7. The method according to claim 1, wherein the forming, by the steady-state impedance and variation impedance of the half-wavelength power transmission line, the concomitant impedance of the half-wavelength power transmission line, and starting the relay protection action of the half-wavelength power transmission line according to the concomitant impedance of the half-wavelength power transmission line in Step (6) comprises:

when an X-phase steady-state impedance $Z_{X\Sigma}$ of the half-wavelength power transmission line meets $Z_{X\Sigma} < Z_{set}$ and an X-phase variation impedance $\Delta Z^{X\Sigma}$ of the half-wavelength power transmission line meets $\Delta Z_{X\Sigma} < \Delta Z_{set}$, starting, by an X phase of the half-wavelength power transmission line, the relay protection action, $Z_{set}$ being a fixed value of the X-phase steady-state impedance of the half-wavelength power transmission line, and $\Delta Z_{set}$ being a fixed value of the X-phase variation impedance of the half-wavelength power transmission line and $X \in \{A,B,C\}$.

* * * * *